(12) United States Patent
Okuda et al.

(10) Patent No.: US 8,901,225 B2
(45) Date of Patent: Dec. 2, 2014

(54) PHOTOSENSITIVE RESIN COMPOSITION, LAMINATE UTILIZING SAME AND SOLID-STATE IMAGING DEVICE

(75) Inventors: Yumiko Okuda, Otsu (JP); Toru Okazawa, Otsu (JP); Masao Kamogawa, Otsu (JP); Mitsuhito Suwa, Otu (JP)

(73) Assignee: Toray Industries, Inc., Tokyo (JP)

( * ) Notice: Subject to any disclaimer, the term of this patent is extended or adjusted under 35 U.S.C. 154(b) by 5 days.

(21) Appl. No.: 13/513,464

(22) PCT Filed: Oct. 26, 2010

(86) PCT No.: PCT/JP2010/068939
§ 371 (c)(1),
(2), (4) Date: Jun. 1, 2012

(87) PCT Pub. No.: WO2011/067998
PCT Pub. Date: Jun. 9, 2011

(65) Prior Publication Data
US 2012/0244473 A1    Sep. 27, 2012

(30) Foreign Application Priority Data
Dec. 4, 2009 (JP) .................................. 2009-276101

(51) Int. Cl.
G03F 7/004 (2006.01)
C08F 2/48 (2006.01)
C08J 3/28 (2006.01)
G03C 1/00 (2006.01)
G03F 7/09 (2006.01)
G03F 7/031 (2006.01)
G03F 7/037 (2006.01)

(52) U.S. Cl.
CPC .............. *G03F 7/037* (2013.01); *G03F 7/091* (2013.01); *G03F 7/031* (2013.01)
USPC ...... 524/431; 524/406; 430/286.1; 430/270.1

(58) Field of Classification Search
CPC ............. G03F 7/004; C08F 2/48; C08J 3/28; H05K 3/287
USPC ............................ 524/431; 430/286.1, 270.1
See application file for complete search history.

(56) References Cited

U.S. PATENT DOCUMENTS

2007/0236596 A1   10/2007   Sekine et al.
2011/0221956 A1   9/2011    Sekine et al.

FOREIGN PATENT DOCUMENTS

| JP | 4-111353 A | | 4/1992 |
|---|---|---|---|
| JP | 6-251621 A | | 9/1994 |
| JP | H06-251621 A | * | 9/1994 |
| JP | 9-208775 A | | 8/1997 |
| JP | 2003-227922 A | | 8/2003 |
| JP | 2006-154516 A | | 6/2006 |
| JP | 2006-309202 A | | 11/2006 |
| JP | 2007-133377 A | | 5/2007 |
| JP | 2007-281929 A | | 10/2007 |
| JP | 2008-76740 A | | 4/2008 |
| JP | 2008076740 A | * | 4/2008 |
| JP | 2008-112147 A | | 5/2008 |
| JP | 2008-311280 A | | 12/2008 |
| JP | 2009-116314 A | | 5/2009 |

OTHER PUBLICATIONS

Hara et al.—JP2008-112147—machine translation.*
International Search Report, dated Nov. 22, 2010, issued in PCT/JP2010/068939.
Supplementary European Search Report, dated Oct. 25, 2013, for European Application No. 10 83 4451.

* cited by examiner

*Primary Examiner* — Ling Choi
*Assistant Examiner* — Ronald Grinsted
(74) *Attorney, Agent, or Firm* — Birch, Stewart, Kolasch & Birch, LLP

(57) ABSTRACT

A photosensitive resin composition which can impart insulating properties and light-shielding properties against light having a wavelength lying in an ultra-violet range, a visible range and a near-infrared range to a substrate more readily when applied onto the substrate, wherein the substrate has such properties that the permeability to light having a wavelength of 400 to 900 nm inclusive is less than 3.0% and the maximum value of the permeability to light having a wavelength of longer than 900 nm and not longer than 1300 nm is 3.0% or more. The photosensitive resin composition is characterized by comprising (a) an alkali soluble resin, (b) a specific tungsten oxide and/or a specific composite tungsten oxide, (c) a photopolymerizable compound having at least two polymerizable groups, (d) an oxime-type photopolymerization initiator, and (e) a solvent.

10 Claims, 2 Drawing Sheets

PHOTOSENSITIVE RESIN COMPOSITION, LAMINATE UTILIZING SAME AND SOLID-STATE IMAGING DEVICE

TECHNICAL FIELD

The present invention relates to a photosensitive resin composition, a laminate utilizing the same and a solid-state imaging device.

BACKGROUND ART

In recent years, miniaturization has been required in solid-state imaging elements such as CCDs (charge coupled devices) and CMOSs (complementary metal-oxide semiconductors) with rapid development of digital cameras and camera-equipped cellular phones. So far, there have been proposed as a small-sized solid-state imaging device comprising a solid-state imaging element, a passive chip that is bonded to the back surface of the solid-state imaging element and electrically connected to the solid-state imaging element, has a terminal for electrical connection to outside on a surface opposite to the surface bonded to the solid-state imaging element, and is provided with a passive component, a dam-like spacer, and a lens holder (see, for example, Patent Document 1) and a camera module comprising a semiconductor substrate with a solid-state imaging element formed thereon, a bonding pad, multiple through electrodes and side electrodes, a passive component electrically connected among the side electrodes and placed on the side surface of the semiconductor substrate, a microlens, a spacer resin, an optical filter and a lens holder (see, for example, Patent Document 2).

One example of the configuration of a solid-state imaging device is shown in FIG. 1. The solid-state imaging device has a lens holder 9 on a semiconductor substrate 3 with a solid-state imaging element 2 formed thereon, and a lens 10 and a glass 11 are caught by the lens holder 9. The glass 11 is formed on the solid-state imaging element 2, and an IR cut filter 8 caught by the lens holder 9 is mounted via a spacer 12. A solder ball 1 is formed at the tip of a through electrode 7 extending through the semiconductor substrate 3 with the solid-state imaging element 2 formed thereon, and the semiconductor substrate 3 and a mounting substrate 4 for mounting the same are connected by the solder ball 1. The semiconductor substrate 3 has an insulating layer 5 on the surface at the mounting substrate 4 side. Light incident from the semiconductor substrate 3 side to the solid-state imaging element 2 interferes with light incident from the lens to produce noises when light is converted into an electrical signal, and therefore it is required to block such incident light. A silicon wafer that is commonly used as the semiconductor substrate 3 shields against light having a wavelength in an ultraviolet range and a visible range, but is permeable to light having a wavelength in a near-infrared range, and therefore incidence of light having a wavelength in an ultraviolet range, a visible range and a near-infrared range is prevented by providing a light-shielding layer 6 that shields against light having a wavelength in a near-infrared range.

As an insulating material that is suitably used for an insulating layer of a solid-state imaging device and the like, there has been proposed, for example, a negative photosensitive resin composition containing an alkali-soluble resin, a compound having at least two polymerizable groups, a photoacid generator, a crosslinker that is reacted by an acid and (E) a solvent (see, for example, Patent Document 3). For a material that shields against light having a wavelength in a near-infrared range, there have been proposed, for example, a dispersion of a near-infrared absorber in which a near-infrared absorber constituted by hexaboride particles having an average particle size of 200 nm or less and comprising at least one element selected from Y, La, Ce, Pr, Nd, Sm, Eu, Gd, Tb, Dy, Ho, Er, Tm, Yb, Lu, Sr and Ca is dispersed in a liquid medium (see, for example, Patent Document 4) and a vinyl chloride-based resin composition containing 0.01 to 10 parts by mass of at least one infrared absorber selected from (a) a metal ion including a bivalent copper ion and (b) a particulate metal oxide including indium oxide and/or tin oxide and 10 to 200 parts by mass of plasticizer based on 100 parts by mass of vinyl chloride-based resin (see, for example, Patent Document 5). As a near-infrared absorber filter, there has been proposed a near-infrared absorber filter for a plasma display panel which contains tungsten oxide particulates and/or composite tungsten oxide particulates having an average dispersion particle size of 800 nm or less and has such properties that the maximum value of the permeability to visible light having a wavelength of 380 to 780 nm is 50% or more and the minimum value of the permeability to near-infrared light having a wavelength of 800 to 1100 nm is 30% or less (see, for example, Patent Document 6).

PRIOR ART DOCUMENTS

Patent Documents

Patent Document 1: Japanese Patent Laid-Open Publication No. 2007-281929
Patent Document 2: Japanese Patent Laid-Open Publication No. 2008-311280
Patent Document 3: Japanese Patent Laid-Open Publication No. 2008-76740
Patent Document 4: Japanese Patent Laid-Open Publication No. 2003-227922 (claims 4 to 7)
Patent Document 5: Japanese Patent Laid-Open Publication No. 9-208775
Patent Document 6: Japanese Patent Laid-Open Publication No. 2006-154516

DISCLOSURE OF THE INVENTION

Problems to be Solved by the Invention

However, a solid-state imaging device having a configuration shown in FIG. 1 has a problem in productivity because multiple materials are applied such that an insulating material is applied onto the back surface of a semiconductor substrate, followed by applying a material shielding against light having a wavelength in a near-infrared range to thereby deposit an insulating layer and a light-shielding layer. Thus, an object of the present invention is to provide a photosensitive resin composition which can more simply impart insulating properties and light-shielding properties against light having a wavelength lying in an ultraviolet range, a visible range and a near-infrared range when applied onto a substrate which has such properties that the permeability to light having a wavelength of 400 to 900 nm inclusive is less than 3.0% and the maximum value of the permeability to light having a wavelength longer than 900 nm and no longer than 1300 nm is 3.0% or more.

Solutions to the Problems

The present invention is a photosensitive resin composition which contains (a) an alkali-soluble resin, (b) a tungsten oxide and/or a composite tungsten oxide represented by the following general formula (1) or (2), (c) a photopolymerizable compound having at least two polymerizable groups, (d) an oxime-type photopolymerization initiator, and (e) a solvent.

$$W_yO_z \tag{1}$$

(In the above general formula (1), W is tungsten, O is oxygen, y>0, z>0, and the requirement of $2.2 \leq z/y \leq 3$ is met.)

$$M_xW_yO_z \tag{2}$$

(In the above general formula (2), element M is at least one element selected from H, He, an alkali metal, an alkali earth metal, a rare earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi and I, W is tungsten, O is oxygen, x>0, y>0, z>0 and the requirements of $0.001 \leq x/y \leq 1.1$ and $2.2 \leq z/y \leq 3.0$ are met.)

Advantages of the Invention

Insulating properties and light-shielding properties against light having a wavelength lying in an ultraviolet range, a visible range and a near-infrared range can be imparted by applying a photosensitive resin composition of the present invention onto a substrate which has such properties that the permeability to light having a wavelength of 400 to 900 nm inclusive is less than 3.0% and the maximum value of the permeability to light having a wavelength longer than 900 nm and no longer than 1300 nm is 3.0% or more. Accordingly, a solid-state imaging device can be provided using a simpler and more productive method.

EMBODIMENTS OF THE INVENTION

Figure 1:
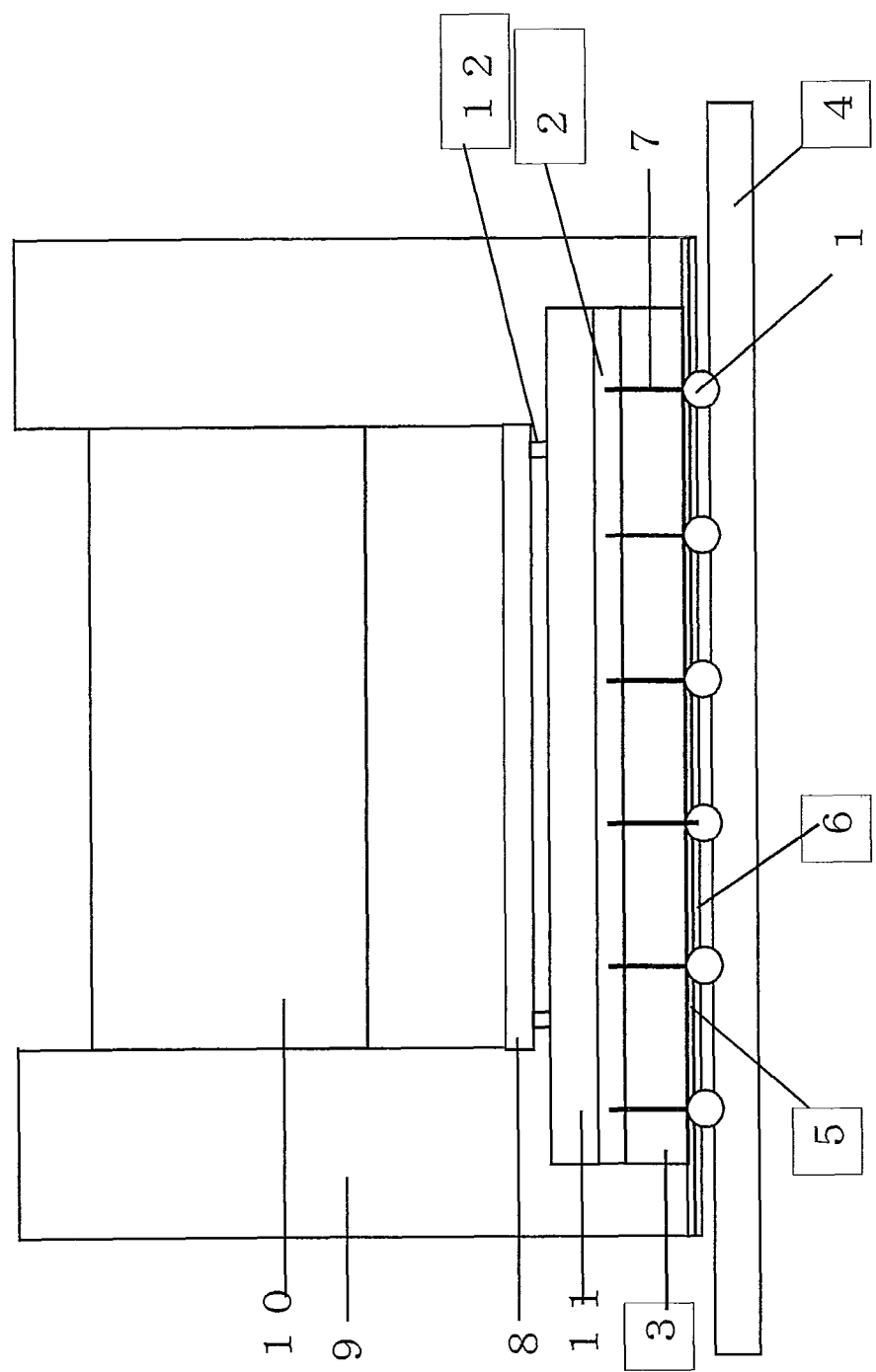
FIG. 1 is a schematic view showing one example of the configuration of a solid-state imaging device.

A photosensitive resin composition of the present invention contains (a) an alkali-soluble resin. "Alkali solubility" in the present invention means that a dissolution rate is 50 nm/minute or more, the dissolution rate being determined from a decrease in film thickness when a solution of a resin in γ-butyrolactone is applied onto a silicon wafer and prebaked at 120° C. for 4 minutes to form a prebake film having a thickness of 10 μm±0.5 μm, and the prebake film is immersed in a 2.38 wt % aqueous tetramethyl ammonium hydroxide solution at 23±1° C. for one minute and then rinsed with pure water.

(a) The alkali-soluble resin to be used in the present invention preferably has an acidic group in a structure unit of a resin and/or at the end of the backbone thereof because the group imparts the alkali solubility described above. Examples of the acidic group include a carboxyl group, a phenolic hydroxyl group, a sulfonic acid group and a thiol group. The resin preferably has fluorine atoms, by which water-repellency can be imparted to a film boundary to suppress penetration through the boundary. The content of fluorine atoms in the alkali-soluble resin is preferably 5% by weight or more from the viewpoint of prevention of penetration through the boundary, and preferably 20% by weight or less from the viewpoint of solubility in an aqueous alkali solution.

The photosensitive resin composition of the present invention preferably uses as (a) the alkali-soluble resin, (a) a polyimide, a polybenzoxazole or a precursor thereof. The polyimide and polybenzoxazole are resins having a cyclic structure of an imide ring or an oxazole ring within a backbone structure. The polyimide precursor and polybenzoxazole precursor are resins having an amide bond in the backbone, and are converted into the polyimide or polybenzoxazole through dewatering cyclization by a heating treatment or a chemical treatment. By incorporating these resins, a resin composition excellent in insulating properties can be obtained. Examples of the polyimide precursor may include polyamide acids, polyamide acid esters, polyamide acid amides and polyisoimides. Examples of the polybenzoxazole precursor may include polyhydroxyamides, polyaminoamides, polyamides and polyamideimides. In any case, the number of repetitions of structural units is preferably 10 to 100000. Two or more kinds thereof may be contained or a copolymer having such two or more kinds of structural units may be contained. A polyimide is more preferable from the viewpoint of chemical resistance when cured by a heat treatment at a low temperature of 250° C. or lower.

The polyimide is generally obtained by dewatering-cyclizing a polyamide acid, which is one polyimide precursor obtained by reacting a tetracarboxylic dianhydride with a diamine, by heating or a chemical treatment with an acid or a base, and has a tetracarboxylic acid residue and a diamine residue.

In the present invention, the polyimide is preferably one having a structural unit represented by the following general formula (3). It may contain two or more kinds thereof or may be a copolymer with other structural unit. The structural unit represented by the following general formula (3) or general formula (4) described later is preferably contained in an amount of 50 mol % or more among all structural units.

[Chemical Formula 1]

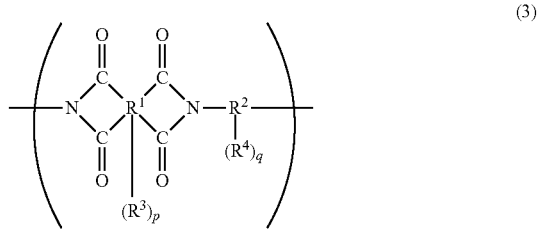

In the above general formula (3), $R^1$ represents a tetra- to decavalent organic group and $R^2$ represents a bi- to octavalent organic group. $R^3$ and $R^4$ represent a phenolic hydroxyl group, a sulfonic acid group or a thiol group, and may each be same or different. p and q represent an integer of 0 to 6, and may each be same or different.

In the above general formula (3), $R^1$—$(R^3)_p$ represents a tetracarboxylic acid residue. $R^1$ is a tetra- to decavalent organic group, and is preferably a tetra- to decavalent organic group having 5 to 40 carbon atoms, which has an aromatic ring or a cyclic aliphatic group.

Examples of an acid dianhydride constituting the tetracarboxylic residue include aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3- dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 1,2,5,6-naphthalenetetracarboxylic dianhydride, 9,9-bis(3,4-dicarboxyphenyl)fluoric dianhydride, 9,9-bis{4-(3,4-dicarboxyphenoxy)phenyl}fluorene dianhydride, 2,3,6,7-naphthalenetetracarboxylic dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, 3,3',4,4'-diphenylsulfonetetracarboxylic dianhydride and acid dianhydrides having the structure shown below, and aliphatic tetracarboxylic dianhydrides such as butanetetracarboxylic dianhydride and 1,2,3,4-cyclopentanetetracarboxylic dianhydride. Two or more kinds thereof may be used.

[Chemical Formula 2]

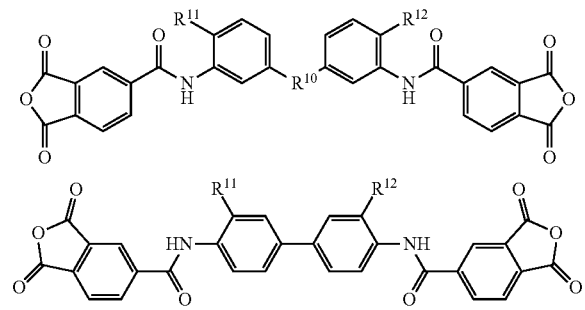

$R^{10}$ represents an oxygen atom, $C(CF_3)_2$, $C(CH_3)_2$ or $SO_2$. $R^{11}$ and $R^{12}$ represent a hydrogen atom, a hydroxyl group or a thiol group.

In the above general formula (3), $R^2$—$(R^4)_q$ represents a diamine residue. $R^2$ is a bi- to octavalent organic group, and is preferably a bi- to octavalent organic group having 5 to 40 carbon atoms, which has an aromatic ring or a cyclic aliphatic group.

Examples of a diamine constituting the diamine residue include 3,4'-diaminodiphenyl ether, 4,4'-diaminodiphenyl ether, 3,4'-diaminodiphenyl methane, 4,4'-diaminodiphenylmethane, 3,4'-diaminodiphenylsulfone, 4,4'-diaminodiphenyl sulfone, 3,4'-diaminodiphenyl sulfide, 4,4'-diaminodiphenyl sulfide, 1,4-bis(4-aminophenoxy)benzene, benzine, m-phenylene diamine, p-phenylene diamine, 1,5-naphthalene diamine, 2,6-naphthalene diamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, 9,9-bis(4-aminophenyl)fluorene, compounds with at least some of hydrogen atoms of these aromatic rings replaced by alkyl groups and halogen atoms, aliphatic diamines such as cyclohexyl diamine and methylenebiscyclohexylamine, and diamines having the structure shown below. Two or more kinds thereof may be used.

[Chemical Formula 3]

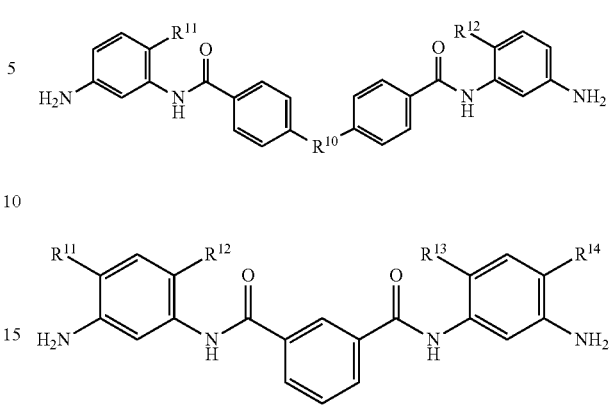

$R^{10}$ represents an oxygen atom, $C(CF_3)_2$, $C(CH_3)_2$ or $SO_2$. $R^{11}$ to $R^{14}$ represent a hydrogen atom, a hydroxyl group or a thiol group.

The polybenzoxazole can be obtained by reacting a bisaminophenol with a dicarboxylic acid, a corresponding dicarboxylic acid chloride, a dicarboxylic acid active ester or the like. Generally, it can be obtained by dewatering-cyclizing a polyhydroxyamide, which is one polybenzoxazole precursor obtained by reacting a bisaminophenol compound with a dicarboxylic acid, by heating or a chemical treatment with a phosphoric anhydride, a base, a carbodiimide compound or the like, and has a dicarboxylic acid residue and a bisaminophenol residue.

Examples of an acid constituting the dicarboxylic acid residue include terephthalic acid, isophthalic acid, diphenyletherdicarboxylic acid, bis(carboxyphenyl)hexafluoropropane, biphenyldicarboxylic acid, benzophenonedicarboxylic acid and triphenyldicarboxylic acid. Two or more kinds thereof may be used.

Examples of a diamine constituting the bisaminophenol residue include diamines having the structure shown below. Two or more kinds thereof may be used.

[Chemical Formula 4]

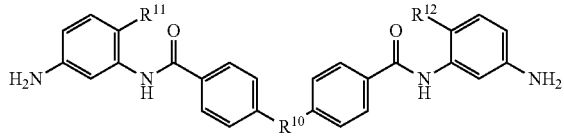

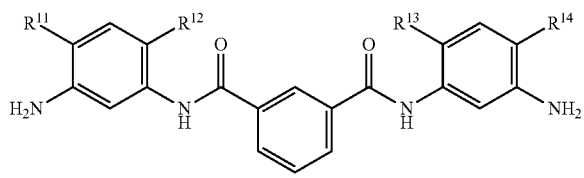

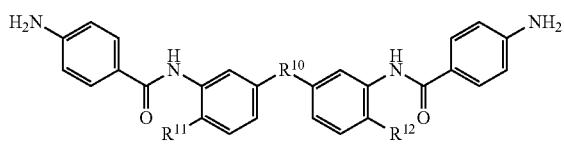

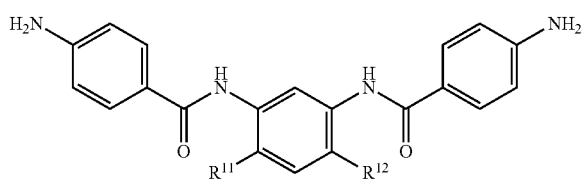

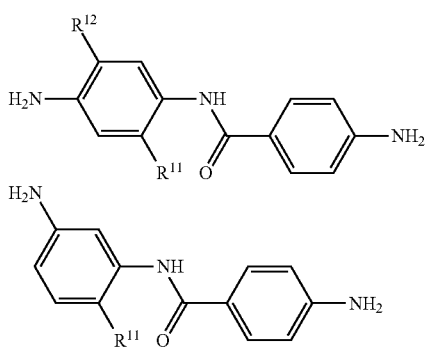

$R^{10}$ represents an oxygen atom, $C(CF_3)_2$, $C(CH_3)_2$ or $SO_2$. $R^{11}$ to $R^{14}$ represent a hydrogen atom, a hydroxyl group or a thiol group, and at least one in each diamine is a hydroxyl group.

The polyimide precursor is obtained by, for example, reacting a tetracarboxylic dianhydride (part of which may be substituted by an acid anhydride, a monoacid chloride compound or a mono-active ester compound) with a diamine compound, and has a tetracarboxylic acid residue and a diamine residue.

The polybenzoxazole precursor is obtained by, for example, reacting a bisaminophenol compound with a dicarboxylic acid, and has a dicarboxylic acid residue and a bisaminophenol residue.

In the present invention, the polyimide precursor and the polybenzoxazole precursor preferably have the general formula (4) described below. They may contain two or more kinds thereof or may be a copolymer with other structural unit. The structural unit represented by the following general formula (4) or the above general formula (3) is preferably contained in an amount of 50 mol % or more among all structural units.

[Chemical Formula 5]

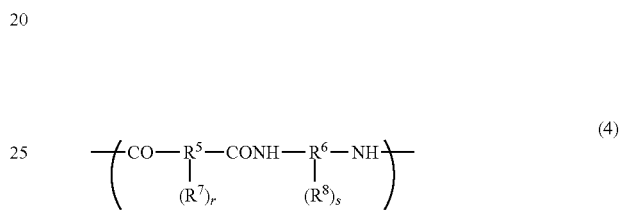

(4)

In the above general formula (4), $R^5$ and $R^6$ represent a bi- to octavalent organic group and each may be same or different. $R^7$ and $R^8$ represent a phenolic hydroxyl group, a sulfonic acid group, a thiol group or $COOR^9$ and may each be same or different. $R^9$ represents a hydrogen atom or a monovalent hydrocarbon group having 1 to 20 carbon atoms. r and s represent an integer of 0 to 6, where r+s>0.

In the above general formula (4), $R^5—(R^7)_r$ represents a acid residue of a dicarboxylic acid, a tetracarboxylic acid, or the like. $R^5$ is a bi- to octavalent organic group, and is preferably a bi- to octavalent organic group having 5 to 40 carbon atoms, which contains an aromatic ring or a cyclic aliphatic group.

As an acid constituting the acid residue, for example, those exemplified as the acid constituting the dicarboxylic acid residue of polybenzoxazole may be mentioned as examples of a dicarboxylic acid. As examples of a tricarboxylic acid, trimellitic acid, trimesic acid, dipehnylethertricarboxylic acid, and biphenyltricarboxylic acid may be mentioned. As examples of a tetracarboxylic acid, mention may be made of aromatic tetracarboxylic acids such as 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxylphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)sulfone, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid, 3,4,9,10-perylenetetracarboxylic acid and tetracarboxylic acids having the structure shown below, and aliphatic tetracarboxylic acids such as butanetetracarboxylic acid and 1,2,3,4-cyclopentanetetracarboxylic acid. Two or more kinds thereof may be used.

[Chemical Formula 6]

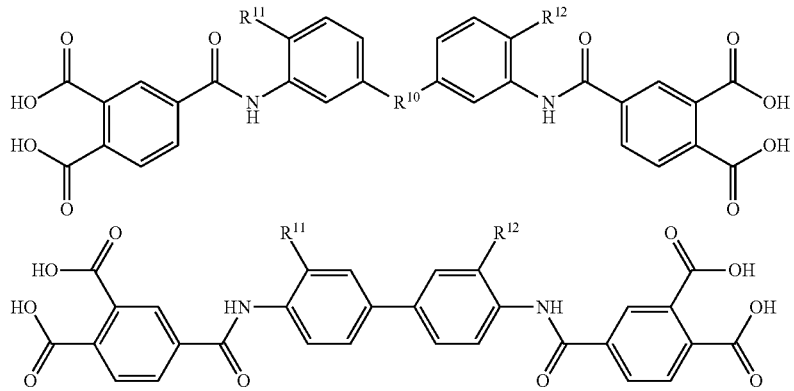

$R^{10}$ represents an oxygen atom, $C(CF_3)_2$, $C(CH_3)_2$ or $SO_2$. $R^{11}$ and $R^{12}$ represent a hydrogen atom, a hydroxyl group or a thiol group.

Among them, in the tricarboxylic acid and the tetracarboxylic acid, one or two carboxy groups correspond to $R^7$ group in the general formula (4). One to 4 hydrogen atoms of the dicarboxylic acid, tricarboxylic acid and tetracarboxylic acid are more preferably replaced by $R^7$ group in the general formula (4), preferably a hydroxyl group, a sulfonic group, a thiol group and the like. These acids may be used directly or as acid anhydrides or active esters.

In the general formula (4), $R^6$—$(R^8)_s$ represents an amine residue of a diamine, a bisphenol and the like. $R^8$ is a bi- to octavalent organic group, and is preferably a bi- to octavalent organic group having 5 to 40 carbon atoms, which has an aromatic ring or a cyclic aliphatic group.

Examples of a diamine constituting the amine residue may include those exemplified as the diamine constituting the diamine residue of polyimide.

The terminals of these resins are preferably sealed with a monoamine, an acid anhydride, an acid chloride or a monocarboxylic acid, having a hydroxyl group, a carboxy group, a sulfonic acid group or a thiol group. Two or more kinds thereof may be used. By having the aforementioned group at the terminal of the backbone, the rate of dissolution of a resin in an aqueous alkali solution can be easily adjusted to a preferred range.

Preferred examples of the monoamine include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyridine, 2-aminophenol, 3-aminophenol, 4-aminophenol, 2-aminothiophenol, 3-aminothiophenol and 4-aminothiophenol. Two or more kinds thereof may be used.

Preferred examples of the acid anhydride, the acid chloride and the monocarboxylic acid include acid anhydrides such as phthalic anhydride, maleic anhydride, nadic acid, cyclohexanedicarboxylic anhydride and 3-hydroxyphthalic anhydride, monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid and 4-carboxybenzenesulfonic acid, and monoacid chloride compounds with the carboxy group of the monocarboxylic acid formed into an acid chloride, monoacid chloride compounds with only one carboxy group of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene and 2,6-dicarboxynaphthalene formed into an acid chloride, and active ester compounds obtained by reaction of a monoacid chloride compound with N-hydroxybenzotriazole and N-hydroxy-5-norbornene-2,3-dicarboxyimide. Two or more kinds thereof may be used.

The content of the terminal sealing agent such as the monoamine, acid anhydride, acid chloride or monocarboxylic acid described above is preferably 2 to 25 mol % based on 100 mol % of the total amount of the acid residue and the amine residue constituting the resin.

The terminal sealing agent introduced into the resin can be easily detected by the following method. For example, the terminal sealing agent can be easily detected by dissolving in an acidic solution a resin containing a terminal sealing agent to separate the resin into an amine component and an acid component which are constituent units of the resin, and subjecting them to gas chromatograph (GC) and NMR measurements. Alternatively, the terminal sealing agent can be detected by directly measuring a resin containing a terminal sealing agent by pyrolysis gas chromatograph (PGC) or infrared spectrum and $^{13}$C-NMR spectrum measurements.

The photosensitive resin composition of the present invention contains (b) a tungsten oxide and/or a composite tungsten oxide represented by the following general formula (1) or (2). Such a compound absorbs light having a wavelength in a near-infrared range, and thus can impart light-shielding properties against light having a wavelength in a near-infrared range to the photosensitive resin composition of the present invention.

$$W_yO_z \qquad (1)$$

In the above general formula (1), W is tungsten, O is oxygen, y>0, z>0, and the requirement of $2.2 \leq z/y \leq 3$ is met. When the requirement of $2.2 \leq z/y \leq 3$ is met, absorption characteristics derived from free electrons can be obtained in a near-infrared range, such a compound is suitable as a near-infrared absorbing material.

$$M_xW_yO_z \quad (2)$$

In the above general formula (2), element M is at least one element selected from H, He, an alkali metal, an alkali earth metal, a rare earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi and I, W is tungsten, O is oxygen, $x>0$, $y>0$, $z>0$ and the requirements of $0.001 \le x/y \le 1.1$ and $2.2 \le z/y \le 3.0$ are met.

Particularly, the composite tungsten oxide preferably has a hexagonal crystal structure from the viewpoint of absorption of light having a wavelength in a near-infrared range, and when the value of x is a value (0.33) calculated theoretically from the hexagonal crystal structure, added element M is placed in all voids of the hexagon, and therefore the capability of absorbing light having a wavelength in a near-infrared range is further improved. Here, preferred element M includes at least one element selected from the elements of Cs, Rb, K, Tl, In, Ba, Li, Ca, Sr, Fe and Sn, and the use of these elements facilitates formation of a hexagonal crystal structure. The value of z is preferably 2.2 to 3.0 inclusive. Generally, it is known that when x, y and z meet the above requirements, the capability of absorbing light having a wavelength in a near range is improved, and $Cs_{0.33}WO_3$ may be mentioned as a typical example.

In the present invention, in particular, the composite tungsten oxide represented by the general formula (2) is preferable.

The content of (b) the compound represented by the general formula (1) or (2) is preferably 5 parts by weight or more, and more preferably 18 parts by weight or more, based on 100 parts by weight of (a) component, from the viewpoint of improvement of light-shielding properties against light having a wavelength in a near-infrared range. On the other hand, the content of the compound is preferably 60 parts by weight or less, and more preferably 20 to 30 parts by weight, based on 100 parts by weight of (a) component, in order that the permeability of the cured film described later to light having a wavelength of 500 nm is 40.0%. The content of the compound is more preferably 40 parts by weight or less from the viewpoints of the pattern shape during formation of a pattern and control of shallowness after development.

(b) The compound represented by the general formula (1) or (2) is preferably in the form of particulates from the viewpoint of dispersibility in a resin. The number average particle size is preferably 1 nm or more, and is preferably 800 nm or less and more preferably 100 nm or less from the viewpoint of suppressing scattering of light having a wavelength in a visible range. In the present invention, the number average particle size of particles of b) the compound represented by the general formula (1) or (2) refers to a value measured by dynamic light scattering. The number average particle size of particles of b) the compound represented by the general formula (1) or (2) can be measured using, for example, Nano-ZS manufactured by Malvern Instruments Ltd.

The photosensitive resin composition of the present invention contains (c) a photopolymerizable compound having at least two polymerizable groups. By incorporating (c) the photopolymerizable compound at least two polymerizable groups and (d) an oxime-type photopolymerization initiator described later, photosensitive properties can be imparted to the resin composition. (c) The photopolymerizable compound having at least two polymerizable groups refers to a compound having an unsaturated bond in a molecule, and the unsaturated bond includes unsaturated double bonds such as a vinyl group, an allyl group, an acryloyl and a methacryloyl group, and unsaturated triple bonds such as a propargyl group. Among them, the conjugate-type vinyl group and acryloyl group and the methacryloyl group are preferable in terms of polymerization properties. The number of unsaturated bonds in the photopolymerization compound having at least two polymerizable groups is preferably 2 to 6 from the viewpoint of stability. When the compound has at least two unsaturated bonds, the groups are not necessarily the same.

Preferred examples of (c) the photopolymerizable compound having at least two polymerizable groups include 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, methylenebisacrylamide, ethylene oxide-modified bisphenol A diacrylate, ethylene oxide-modified bisphenol A dimethacrylate, diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, 1,3-diisopropenylbenzene, 1,3-butanediol diacrylate, 1,3-butanediol dimethacrylate, neopentyl glycol diacrylate, 1,4-butanediol diacrylate, 1,4-butanediol dimethacrylate, 1,6-hexanediol diacrylate, 1,6-hexanediol dimethacrylate, 1,3-diacryloyloxy-2-hydroxypropane and 1,3-dimethacryloyloxy-2-hydroxypropane. Among them, particularly preferred examples include 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, methylenebisacrylamide, ethylene oxide-modified bisphenol A diacrylate and ethylene oxide-modified bisphenol A dimethacrylate. Two or more kinds thereof may be contained.

The content of (c) the photopolymerizable compound having at least two polymerizable groups is preferably 5 parts by weight or more based on 100 parts by weight of resin of (a) component, whereby the film loss of an exposed area during development can be further reduced. The content of the photopolymerizable compound is preferably 150 parts by weight or less, whereby compatibility with the resin of (a) component can be improved, and whitening of the film can be suppressed.

The photosensitive resin composition of the present invention preferably further contains (c)' a photopolymerizable compound having only one polymerizable group. Agglomeration of particles can be thereby suppressed.

Preferred examples of (c)' the photopolymerizable compound having only one polymerizable group include N,N-dimethylaminoethyl acrylate, N,N-dimethylaminoethyl methacrylate, 2-hydroxyethyl acrylate, 2-hydroxyethyl methacrylate, N,N-dimethylaminopropyl acrylamide, N,N-dimethylaminopropyl methacrylamide, N-methylol acrylamide, butyl acrylate, butyl methacrylate, isobutyl acrylate, hexyl acrylate, isooctyl acrylate, cyclohexyl methacrylate, isobornyl acrylate, isobornyl methacrylate, N,N-dimethyl acrylamide, N,N-dimethyl methacrylamide, N-methylol acrylamide, 2,2,6,6-tetramethylpiperizinyl methacrylate, 2,2,6,6-tetramethylpiperizinyl acrylate, N-methyl-2,2,6,6-tetramethylpiperizinyl methacrylate, N-methyl-2,2,6,6-tetramethylpiperizinyl acrylate, N-vinylpyrrolidone, N-vinylcaprolactam, 2-isocyanatoethyl acrylate, 2-isocyanatoethyl methacrylate, 3-isocyanatopropyl acrylate, 3-isocyanatopropyl methacrylate, 2-isocyanato-1-methylethyl acrylate, 2-isocyanato-1-methylethyl methacrylate, 3-acryloyloxyphenyl isocyanate, 3-methacryloyloxyphenyl isocyanate, 3-isocyanato-2-methylbutyl acrylate, 3-isocyanato-2-methylbutylmethacrylate, 4-acryloyloxyphenyl isocyanate, 4-methacryloyloxyphenyl isocyanate, 3-acryloyloxyphenyl isocyanate, 3-methacryloyloxyphenyl isocyanate, 2-acryloyloxyphenyl isocyanate and 2-methacryloyloxyphenyl isocyanate. Two or more kinds thereof may be contained.

The content of (c)' the photopolymerizable compound having only one polymerizable group is preferably 10 parts by weight or more based on 100 parts by weight of (c) compound having at least two polymerizable groups, whereby agglomeration of particles can be adequately suppressed. The content of the compound is preferably 60 parts by weight or less, whereby a crosslinking structure adequate to suppress release of an exposed area is established by (c) the photopolymerizable compound having at least two polymerizable groups.

The photosensitive resin composition of the present invention contains (d) an oxime-type photopolymerization initiator. Examples of (d) the oxime-type photopolymerization initiator include oximes such as 1-phenyl-1,2-butanedione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, bis(α-isonitrosopropiophenoneoxime) isophthal, 1,2-octanedione-1-[4-(phenylthio)phenyl]-2-(o-benzoyloxime), OXE-01 (trade name, manufactured by Chiba Specialty Chemicals Co., Ltd.) and OXE-02 (trade name, manufactured by Chiba Specialty Chemicals Co., Ltd.). Two or more kinds thereof may be contained.

The content of (d) the oxime-type photopolymerization initiator is preferably 1 part by weight or more based on 100 parts by weight of (a) component, whereby the film loss of an exposed area during development can be further reduced to improve the shape of a pattern. The content of the initiator is preferably 50 parts by weight or less, whereby film characteristics of the cured film can be improved. Further a sensitizer may be contained as required.

The photosensitive resin composition of the present invention contains (e) a solvent. As (e) the solvent, an organic solvent having a boiling point of 80 to 250° C. under atmospheric pressure. Specifically, the organic solvent includes ethers such as ethylene glycol monomethyl ether, ethylene glycol monoethyl ether, propylene glycol monomethyl ether, propylene glycol monoethyl ether, ethylene glycol dimethyl ether, ethylene glycol diethyl ether and ethylene glycol dimethyl ether, acetates such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate and butyl lactate, ketones such as acetyl acetone, methyl propyl ketone, methyl butyl ketone, methyl isobutyl ketone, cyclopentanone and 2-heptanone, alcohols such as butyl alcohol, isobutyl alcohol, pentanol, 4-methyl-2-pentanol, 3-methyl-2-butanol, 3-methyl-3-methoxybutanol and diacetone alcohol, aromatic hydrocarbons such as toluene and xylene, N-methyl-2-pyrolidone, N-cyclohexyl-2-pyrolidone, N,N-dimethylformamide, N,N-dimethylacetamide, dimethyl sulfoxide and γ-butyrolactone. Two or more kinds thereof may be contained.

Among them, more preferable are those that dissolve (a) the component and have a boiling point of 120 to 200° C. under atmospheric pressure. If the boiling point lies within this range, vaporization during application of the photosensitive resin composition can be suppressed and the heat treatment temperature for removal of the solvent can be reduced, and therefore there arises no limitation on the material of an underlying substrate. By using a solvent that dissolves (a) the component, a uniform coating film can be formed on the underlying substrate. A preferred organic solvent having such a boiling point includes, specifically, cyclopentane, ethylene glycol monomethyl ether, ethylene glycol monoethyl ether, propylene glycol monomethyl ether, methyl lactate, ethyl lactate, diacetone alcohol and 3-methyl-3-methoxybutanol.

The content of the organic solvent is preferably in the range of 100 to 400 parts by weight based on 100 parts by weight of (a) component from the viewpoints of the solubility of (a) to (d) the components and the viscosity during application.

The photosensitive resin composition of the present invention may contain a crosslinker which is reacted by an acid or/and heat. The heat resistance and chemical resistance of a cured film can be thereby improved. Particularly when the curing temperature is 250° C. or less, the effect of improving the chemical resistance is further remarkably exhibited. The crosslinker includes crosslinkers that are reacted by an acid or crosslinkers that are reacted by heat, and any one thereof may be used, or two or more kinds thereof may be used in combination.

Examples of the crosslinkers that are reacted by an acid include compounds having nitrogen atoms which are bound to a methylol group and/or an alkoxymethyl group. These compounds include, for example, compounds prepared by reacting formaldehyde or formaldehyde and an alcohol with an amino group-containing compound such as melamine, glycol uril, urea, alkylene urea or benzoguanamine and substituting hydrogen atoms of the amino group with a methylol group or an alkoxymethyl group. The crosslinker may also be an oligomer formed by self-condensation of the methylol groups of these compounds.

Further, examples of a heat crosslinker include, for example, ML-26X, ML-24X, ML-236TMP, 4-Methylol 3M6C, ML-MC, ML-TBC, DML-MBPC, DML-MBOC, DML-OCHP, DML-PC, DML-PCHP, DML-PTBP, DML-34X, DML-EP, DML-POP, DML-OC, Dimethylol-Bis-C, Dimethylol-BisOC-P, DML-BisOC-Z, DML-BisOCHP-Z, DML-PFP, DML-PSBP, DML-MB25, DML-MTrisPC, DML-Bis25X-34XL, DML-Bis25X-PCHP, TriML-P, TriML-35XL, TriML-TrisCR-HAP, TML-BP, TML-HQ, TML-pp-BPF, TML-BPA, TMOM-BP, HML-TPPHBA, HML-TPHAP, HMOM-TPPHBA, HMOM-TPHAP (trade names, manufactured by Honshu Chemical Industry Co., Ltd.), B-a Type Benzoxazine, B-m Type Benzoxazine (trade names, manufactured by Shikoku Chemicals Corporation), 2,6-dimethoxymethyl-4-t-butylphenol, 2,6-dimethoxymethyl-p-cresol and 2,6-diacetoxymethyl-p-cresol.

The photosensitive resin composition of the present invention may contain a photoacid generator. The photoacid generator is a substance which generates an acid such as a sulfonic acid or a carboxylic acid, and a compound having such a nature includes sulfonium salt compounds, iodonium salt compounds, sulfonimide compounds, sulfonate compounds, diazomethane compounds and triazine compounds. Two or more kinds thereof may be contained.

The photosensitive resin composition of the present invention may contain other resin in addition to (a) the component. In this case, other resin may be selected as appropriate from the viewpoint of the heat resistance and insulating properties of a cured film, and the resin of (a) the component is preferably contained in an amount of 50% by weight or more of the entire resin.

Further, a surfactant may be contained as required, whereby wettability with the substrate can be improved. A silane coupling agent such as methylmethacryloxy dimethoxysilane or 3-aminopropyl trimethoxysilane, a titanium chelating agent, an aluminum chelating agent and the like may be contained, and the content thereof is preferably 0.5 to 10% by weight in the photosensitive resin composition. By incorporating these compounds, adhesion properties with an underlying substrate such as a silicon wafer can be improved.

The photosensitive resin composition of the present invention preferably such properties that the permeability to light having a wavelength of 500 nm is 40.0% or more and the permeability to light having a wavelength of longer than 900 nm and no longer than 1300 nm is less than 3.0% provided that (e) the solvent is removed to form a photosensitive resin film having a thickness of 25 µm, and the film is heat-treated (prebaked) by a hot plate at 100° C. for 3 minutes, and then heat-treated in an oven at 180° C. under a nitrogen atmosphere (oxygen concentration 10 ppm or less) for 120 minutes. The permeability to light having a wavelength of 500 nm after the heat treatment is a property providing a barometer of the permeability of the photosensitive resin film to light having a wavelength in an ultraviolet range and a visible range after prebaking, and if the value is 40.0% or more, alignment with the substrate is facilitated in the light exposing step described later. The content is more preferably 50.0% or more. If the permeability to light having a wavelength of longer than 900 nm and no longer than 1300 nm after the heat treatment is less than 3.0%, light passing through a silicon wafer that is commonly used as a semiconductor substrate can be sufficiently blocked, and image noises can be suppressed when used in a solid-state imaging device. A permeability in this range is easily achieved by, for example, adjusting the content of (b) the compound represented by the general formula (1) or (2) in the photosensitive resin composition. For instance, mention is made of a method in which the content of (b) the compound represented by the general formula (1) or (2) in the photosensitive resin composition is 60 parts by weight or less based on 100 parts by weight of (a) component. The content is more preferably 20 to 30 parts by weight.

A method for producing the photosensitive resin composition of the present invention will now be described with examples, but it is not limited to the following method.

(a) A component is dissolved in (e) a solvent with stirring or a resin solution prepared by carrying out a polymerization reaction for obtaining (a) the component is used directly, and with this resin solution is mixed (c) and (d) components at a predetermined ratio, followed by adding (b) a compound represented by general formula (1) or (2) and mixing to form a uniform solution. (b) The compound represented by general formula (1) or (2) may be dispersed in (e) the solvent beforehand. Other additives are mixed at an appropriate stage as required. The photosensitive resin composition thus obtained is preferably filtered by a filter having a pore size of about 0.2 to 5 µm.

A laminate of the present invention will now be described. The laminate of the present invention has a cured film formed by heat-treating a photosensitive resin film formed from the photosensitive resin composition of the present invention and having such properties that the permeability to light having a wavelength of 500 nm is 40.0% or more and the permeability to light having a wavelength of longer than 900 nm and no longer than 1300 nm is less than 3.0%, on a substrate which has such properties that the permeability to light having a wavelength of 400 to 900 nm inclusive is less than 3.0% and the maximum value of the permeability to light having a wavelength longer than 900 nm and no longer than 1300 nm is 3.0% or more.

The substrate having properties that the permeability to light having a wavelength of 400 to 900 nm inclusive is less than 3.0% and the maximum value of the permeability to light having a wavelength longer than 900 nm and no longer than 1300 nm is 3.0% or more includes a silicon wafer and a SiN substrate having a nitride film formed on a silicon wafer.

The permeability of the cured film to light having a wavelength of 500 nm is a property providing a barometer of the permeability of the photosensitive resin film to light having a wavelength in an ultraviolet range and a visible range after prebaking, and if the value is 40.0% or more, alignment with the substrate is facilitated in the light exposing step described later. The value is more preferably 50.0% or more. If the permeability to light having a wavelength of longer than 900 nm and no longer than 1300 nm after the heat treatment is less than 3.0%, light passing through a silicon wafer that is commonly used as a semiconductor substrate can be sufficiently blocked, and image noises can be suppressed when used in a solid-state imaging device. A permeability in this range is easily achieved by, for example, adjusting the content of (b) the compound represented by the general formula (1) or (2) in the photosensitive resin composition and the thickness of the cured film. For instance, in the case where the thickness of the cured film is 25 µm, mention is made of a method in which the content of (b) the compound represented by the general formula (1) or (2) in the photosensitive resin composition is 60 parts by weight or less based on 100 parts by weight of (a) component. The content is more preferably 20 to 30 parts by weight. The thickness of the cured film is preferably 15 to 40 µm.

The laminate of the present invention preferably has such properties that the permeability to light having a wavelength of 400 nm to 1300 nm inclusive is 1.0% or less, whereby image noises can be further suppressed when used in a solid-state imaging device. The permeability of the laminate as a whole is determined from a product of the permeability of the substrate and the permeability of the cured film and for example, in the case where a cured film formed from the photosensitive resin composition and having a thickness of 25 µm is present on a silicon wafer having a thickness of 625 nm, mention is made of a method in which the content of (b) the compound represented by the general formula (1) or (2) in the photosensitive resin composition is 60 parts by weight or less based on 100 parts by weight of (a) component. The content is more preferably 20 to 30 parts by weight.

A method for producing the laminate of the present invention will now be described.

The photosensitive resin composition of the present invention is applied onto a substrate which has such properties that the permeability to light having a wavelength of 400 to 900 nm inclusive is less than 3.0% and the maximum value of the permeability to light having a wavelength longer than 900 nm and no longer than 1300 nm is 3.0% or more. The substrate may be pretreated with a silane coupling agent such as methylmethacryloxy dimethoxysilane or 3-aminopropyl trimethoxysilane, a titanium chelating agent, an aluminum chelating agent or the like. For example, using a solution prepared by dissolving the coupling agent or the like in a solvent such as isopropanol, ethanol, methanol, water, tetrahydrofuran, propylene glycol monomethyl ether acetate, propylene glycol monomethyl ether, ethyl lactate or diethyl adipate in an amount of 0.5 to 20% by weight, the surface of the substrate is treated by a method such as spin coating, dipping, spray coating or vapor treatment. By carrying out a heat treatment at 50 to 300° C. thereafter as required, a reaction of the substrate with the coupling agent can be facilitated.

A Method for applying the photosensitive resin composition includes methods such as spin coating using a spinner, spray coating and roll coating. The coating thickness varies depending on the applying method, the solid concentration of the composition and the viscosity, but the post-drying thickness is generally 15 to 40 μm.

Next, the substrate coated with the photosensitive resin composition is heat-treated (prebaked) to obtain a photosensitive resin film. The prebake treatment is preferably carried out at 50 to 150° C. for one minute to several hours using an oven or a hot plate and for example, mention is made of a method in which a heat treatment is carried out by a hot plate at 100° C. for 3 minutes.

When patterning processing is carried out, the substrate is exposed by irradiation with an actinic ray. The actinic ray that is used for exposure includes ultraviolet rays, visible light rays, electron beams and X rays, but in the present invention is preferable a light ray of mixed i ray (365 nm), h ray (405 nm) and g ray (436 nm) from a mercury lamp. Next, a bake treatment after exposure may be carried out. The temperature for the bake treatment is preferably in the range of 50 to 180° C., more preferably in the range of 60 to 150° C. The time is not particularly limited.

After exposure, a developer is used to remove unexposed areas. As a developer, for example, N-methyl-2-pyrolidone, N-acetyl-2-pyrolidone, N,N-dimethylformamide, N,N-dimethylacetamide, dimethyl sulfoxide, hexamethylphosphortriamide, or the like may be used alone, or in combination with an organic solvent such as methanol, ethanol, isopropyl alcohol, methyl carbitol, ethyl carbitol, toluene, xylene, ethyl lactate, ethyl pyruvate, propylene glycol monomethyl ether acetate, methyl-3-methoxy propionate, ethyl-3-ethoxy propionate, 2-heptanone or ethyl acetate, or an aqueous solution of tetramethyl ammonium or an aqueous solution of a compound showing an alkalinity, such as diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine or hexamethylenediamine may be used. Particularly, an aqueous solution of tetramethyl ammonium and an aqueous solution of a compound showing an alkalinity, such as diethanolamine, diethylaminoethanol, sodium hydroxide, potassium hydroxide, sodium carbonate, potassium carbonate and triethylamine are preferable. In some cases, a combination of such an aqueous alkali solution with one or several kinds of polar solvents such as N-methyl-2-pyrolidone, N,N-dimethylformamide, N,N-dimethylacetamide, dimethyl sulfoxide, γ-butyrolactone and dimethyl acrylamide, alcohols such as methanol, ethanol and isopropanol, esters such as ethyl acetate and propylene glycol monomethyl ether acetate and ketones such as cyclopentane, cyclohexane, isobutylketone and methylisobutylketone may be added. A rinsing treatment is preferably carried out with water after development. Here, the rinsing treatment may be carried out with alcohols such as ethanol and isopropyl alcohol, esters such as ethyl lactate and propylene glycol monomethyl ether acetate and the like added to water.

Thereafter, a heat treatment is carried out at 120 to 400° C. to form a cured film. This heat treatment may be carried out for 5 minutes to 5 hours such that a temperature is selected and the temperature is elevated stepwise, or a certain temperature range is selected and the temperature is continuously elevated. As one example, mention is made of a method in which a heat treatment is carried out at 130° C., 200° C. and 300° C. for 30 minutes, respectively, a method in which the temperature is elevated linearly from room temperature to 300° C. for 2 hours, a method in which a heat treatment is carried out under a nitrogen atmosphere (oxygen concentration 10 ppm) in an oven at 180° C. for 120 minutes.

Figure 2:
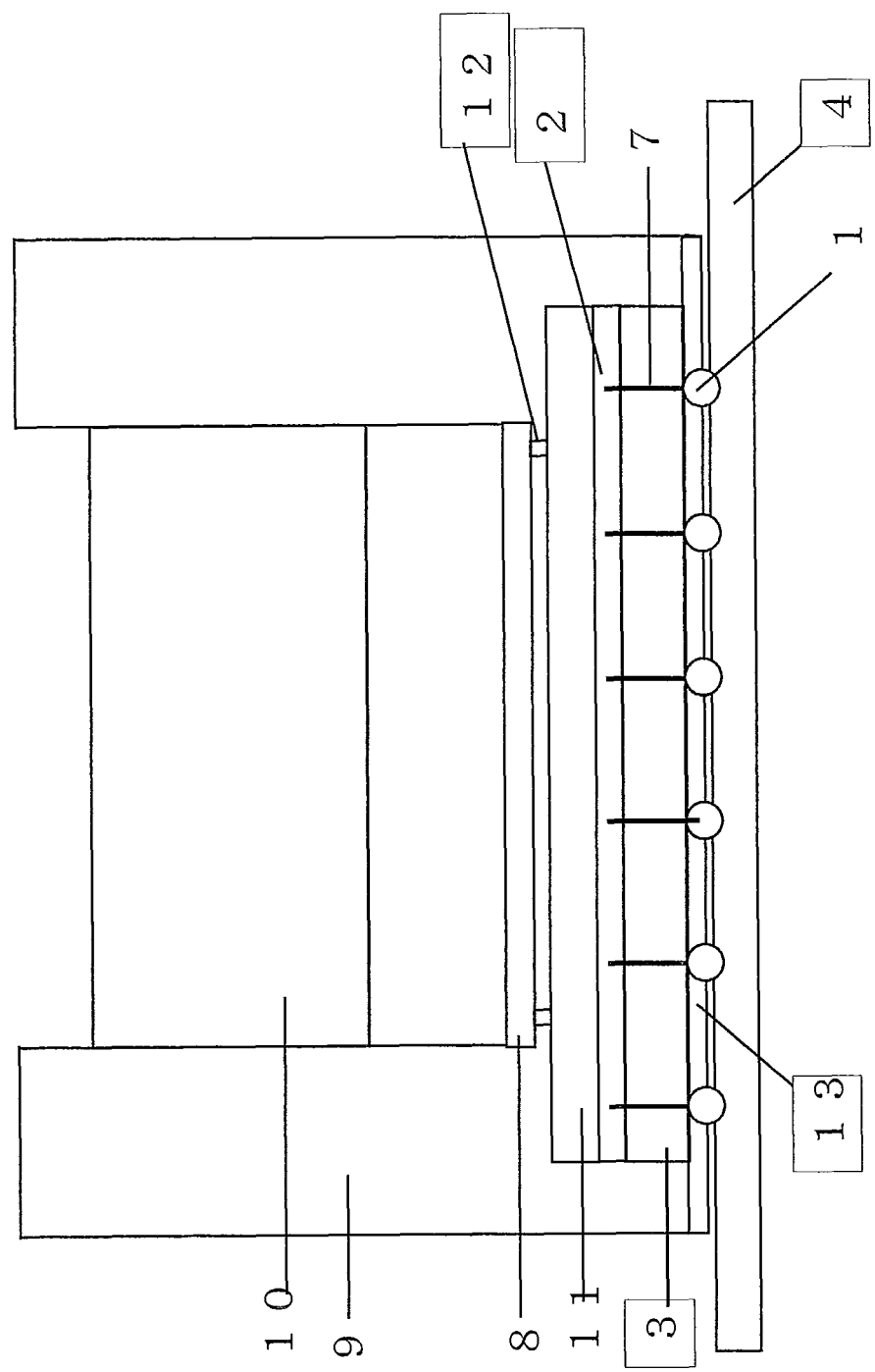
FIG. 2 is a schematic view showing one example of the solid-state imaging device of the present invention.

The photosensitive resin composition of the present invention may be suitably used as a photosensitive light-shielding and insulating material that is applied on the back surface of a silicon wafer in a solid-state imaging device using a Si through electrode. A schematic view showing one example of the solid-state imaging device of the present invention is shown in FIG. 2. The solid-state imaging device has a lens holder 9 on a semiconductor substrate 3 with a solid-state imaging element 2 formed thereon, and a lens 10 and a glass 11 are caught by the lens holder 9. The glass 11 is formed on the solid-state imaging element 2, and an IR cut filter 8 caught by the lens holder 9 is mounted via a spacer 12. A solder ball 1 is formed at the tip of a through electrode 7 extending through the semiconductor substrate 3 with the solid-state imaging element 2 formed thereon, and the semiconductor substrate 3 and a mounting substrate 4 for mounting the same are connected by the solder ball 1. The semiconductor substrate 3 has, on the surface at the mounting substrate 4 side, a light-shielding and insulating layer 13 formed using the photosensitive resin composition of the present invention. The photosensitive resin composition of the present invention has insulating properties, and therefore plays a role as an insulating layer and can shield against light having a wavelength in a visible range and a near-infrared range. On the other hand, the semiconductor substrate 3 shields against light having a wavelength in an ultraviolet range and a visible range, of light incident from the semiconductor substrate 3 side to the solid-state imaging device 2, thus making it possible to shield against light having a wavelength in an ultraviolet range, a visible range and a near-infrared range.

EXAMPLES

The present invention will be described below with Examples, but the present invention is not limited by these examples. Evaluations of resins in Synthesis Examples and photosensitive resin compositions in Examples were made in accordance with the following method.

Method for Measurement of Thickness

Measurements were made at a refraction index of 1.58 using RamdaA STM-602 manufactured by Dainippon Screen Mfg. Co., Ltd. In the case where the film thickness was 30 μm or more, the cross section was observed with a scanning electron microscope S-4800 (manufactured by Hitachi, Ltd.) to measure the thickness.

Preparation of Photosensitive Resin Film

A photosensitive resin composition (hereinafter referred to as varnish) was applied onto a 6-inch silicon wafer so as to have a thickness of 28 μm after prebaking, and then prebaked at 100° C. for 3 minutes using a hot plate (Mark-7 manufactured by Tokyo Electron Ltd.) to thereby obtain a photosensitive resin film.

Exposure

A reticle having a pattern of 150 um line-and-spaces and squares of 150 um×150 um was set in an exposure unit (all-wavelength Stepper Spectrum 3e manufactured by Ultratech, Inc.) and the photosensitive resin film was subjected to all-wavelength exposure at an exposure amount of 1000 mJ/cm$^2$ (i ray equivalent).

Development

A 2.38 wt % aqueous tetramethylammonium hydroxide solution was sprayed to the exposed photosensitive resin film at 50 rotations for 10 seconds using a Mark-7 development apparatus manufactured by Tokyo Electron Ltd. Thereafter, it was left standing at 50 rotations for 30 seconds. This operation was repeated twice. By carrying out a rinsing treatment with water at 400 rotations and shaking-drying at 3000 rotations for 10 seconds, a post-development film was obtained.

Heat-Treatment (Cure)

The post-development film was heat-treated under a nitrogen gas stream (oxygen concentration 10 ppm or less) at 180° C. for 120 minutes using Inert Oven INH-21CD (Koyo Thermo Systems Co., ltd.) to obtain a cured film.

Evaluation of Shape of Pattern

The cross section of the cured film was observed with a scanning electron microscope S-4800 (manufactured by Hitachi, Ltd.) to determine a ratio of the length of the lower side of the cross section to the length of the upper side of the cross section (length of lower side/length of upper side) in a pattern of squares of 150 um×150 um. If this value is 50% or more, it can be determined that the shape of a pattern is good.

Evaluation of Shallowness

The cured film was observed with an optical microscope at 5× magnification, and presence/absence of undissolved and remaining resin composition (shallowness) on unexposed areas was evaluated in three scales.

⊙: No undissolved residues are present between left patterns cured by exposure at intervals of 150 um.

○: Undissolved residues are present within areas of 15 um from the pattern between left patterns cured by exposure at intervals of 150 um.

Δ: Undissolved residues are also present in areas beyond 15 μm from the pattern between left patterns cured by exposure at intervals of 150 um, but patterns can be distinguished from one another.

Measurement of Permeation to Light

For cured films with a thickness of 25 μm prepared on a 6-inch wafer (manufactured by KST World Corp.; substrate having a wafer thickness of 625 nm and having such properties that the permeability to light having a wavelength of 400 to 900 nm inclusive is 0% and the maximum of the permeability to light having a wavelength longer than 900 nm and no longer than 1300 nm is 49.2%) as for the light permeability of the laminate and those prepared on TEMPAX glass (manufactured by DAICO MFG CO., Ltd.) as for the permeability of the photosensitive resin film, the permeability to light having a wavelength of 350 to 1400 nm was measured using a spectrophotometer UV-3150 manufactured by Shimadzu Corporation.

Synthesis Example 1

Synthesis of Hydroxyl Group-containing Diamine Compound (I)

18.3 g (0.05 mol) of bis(3-amino-4-hydroxyphenyl) hexafluoropropane (manufactured by Central Glass Co., Ltd., BAHF) was dissolved in 100 mL of acetone and 17.4 g (0.3 mol) of propylene oxide, and the solution was cooled to −15° C. Thereto was added dropwise a solution prepared by dissolving 20.4 g (0.11 mol) of 4-nitrobenzoyl chloride in 100 mL of acetone. After completion of the dropwise addition, the resultant mixture was reacted at −15° C. for 4 hours, and then returned to room temperature. A precipitated white powder was filtered, and dried in vacuum at 50° C.

30 g of powder was placed in a 300 mL stainless autoclave, and dispersed in 250 mL of methyl cellosolve, and 2 g of 5% palladium-carbon was added thereto. Hydrogen was introduced thereinto by a balloon to carry out a reduction reaction at room temperature. After about 2 hours, the reaction was completed as it was confirmed that the balloon no longer deflated. After completion of the reaction, a palladium compound as a catalyst was removed by filtration and the filtrate was concentrated by a rotary evaporator, to obtain a hydroxyl group-containing diamine compound (I) represented by the following formula.

[Chemical Formula 7]

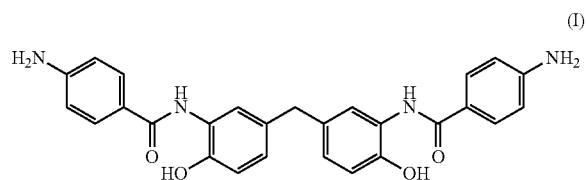

(I)

Synthesis Example 2

Synthesis of Polyimide Resin 29.3 g (0.08 mol) of BAHF, 1.24 g (0.005 mol) of 1,3-bis (3-aminopropyl)tetramethyldisiloxane and 3.27 g (0.03 mol) of 3-aminophenol (manufactured by TOKYO KASEI KOGYO CO., LTD.) as a terminal sealing agent were dissolved in 150 g of N-methyl-2-pyrolidone under a dry nitrogen stream. Thereto was added 31.0 g (0.1 mol) of bis(3,4-dicarboxyphenyl)ether dianhydride (manufactured by MANAC Incorporated, ODPA) together with 50 g of NMP, and the resultant mixture was stirred at 20° C. for 1 hour, and then stirred at 50° C. for 4 hours. Thereafter, 15 g of xylene was added, and the resultant mixture was stirred at 150° C. for 5 hours while azeotropically boiling water with xylene. After completion of stirring, the solution was introduced into 3 L of water to collect a white precipitate. The precipitate was collected by filtration, washed with water three times, and then dried in a vacuum drier at 80° C. for 24 hours to obtain a polyimide powder.

Synthesis Example 3

Synthesis of Polyamide Acid Ester 48.4 g (0.08 mol) of hydroxyl group-containing diamine compound (I) obtained in Synthesis Example 1, 1.24 g (0.005 mol) of 1,3-bis(3-aminopropyl)tetramethyldisiloxane and 3.27 g (0.03 mol) of 3-aminophenol (manufactured by TOKYO KASEI KOGYO CO., LTD.) as a terminal sealing agent were dissolved in 150 g of NMP under a dry nitrogen stream. Thereto was added 31.0 g (0.1 mol) of ODPA together with 50 g of NMP, and the resultant mixture was stirred at 40° C. for 3 hours. Thereafter, a solution prepared by diluting 5.19 g (0.127 mol) of N,N-dimethylformamide dimethyl acetal with 4 g of NMP was added dropwise for 10 minutes. After the dropwise addition, the mixture was stirred at 50° C. for 3 hours. After completion of the reaction, the solution was introduced into 3 L of water to collect a white precipitate. The precipitate was collected by filtration, washed with water three times, and then dried in a vacuum drier at 50° C. for 72 hours to obtain a polyamide acid ester as a polyimide precursor. The esterification rate of polyamide acid thus obtained was 100%.

Synthesis Example 4

Synthesis of Polyhydroxyamide 18.3 g (0.05 mol) of BAHF was dissolved in 50 g of NMP and 26.4 g (0.3 mol) of glycidyl methyl ether under a dry nitrogen stream, and the solution was cooled to −15° C. Thereto was added dropwise a solution prepared by dissolving 14.7 g of diphenylether dicarboxylic acid dichloride (manufactured by Nihon Nohyaku Co., Ltd., 0.050 mol) in 25 g of γ-butyrolactone (GBL) such that the internal temperature did not exceed 0° C. After completion of the dropwise addition, the resultant mixture was continuously stirred at −15° C. for 6 hours. After completion of the reaction, the solution was introduced into 3 L of water containing 10% by weight of methanol to collect a white precipitate. The precipitate was collected by filtration, washed with water three times, and then dried in a vacuum drier at 50° C. for 72 hours to obtain a polyhydroxyamide powder as a polybenzoxazole precursor.

Synthesis Example 5

Synthesis of Polyamide Acid Solution 43.3 g of 4,4'-diaminophenyl ether, 50.6 g of paraphenylenediamine and 8.9 g of 1,3-bis(3-aminopropyl)tetramethyldisiloxane were placed together with 850 g of GBL and 850 g of NMP, 231.4 g of 3,3',4,4'-oxydiphthalcarboxylic dianhydride was added, and the resultant mixture was stirred at 80° C. for 3 hours. 1.4 g of maleic anhydride was added, and the resultant mixture was further stirred at 80° C. for 1 hour to obtain a polyamide acid solution (polymer concentration: 20% by weight) as a polyimide precursor.

Synthesis Example 6

Preparation of Titanium Nitride Particle Dispersion 96 g of titanium nitride particles (manufactured by Nisshin Engineering Inc., TiN UFP Lot 13306B10) produced by a thermal plasma process, 120 g of polyamide acid solution described in Synthesis Example 5, 114 g of GBL, 538 g of NMP and 132 g of 3-methyl-3-methoxybutyl acetate were placed in a tank, and stirred by a homomixer (manufactured by Tokushukika Kogyo Co., Ltd.) for 1 hour to obtain a preliminary dispersion 1. Thereafter, the preliminary dispersion 1 was fed into Ultra Apex Mill (manufactured by KOTOBUKI INDUSTRIES) having a centrifugal separator filled with 70% of 0.05 mmφ zirconia beads (manufactured by NIKKATO CORPORATION, YTZ Ball), and dispersed at a rotation speed of 8 m/second for 2 hours to obtain a titanium nitride particle dispersion having a solid concentration of 12% by weight and a titanium nitride particle/resin (weight) ratio of 80/20.

Synthesis Example 7

Preparation of Carbon Black Dispersion

A preliminary dispersion 2 was obtained in the same manner as in Synthesis Example 6 except that 96 g of titanium nitride particles (manufactured by Nisshin Engineering Inc., TiN UFP Lot 13306B10) was replaced by 96 g of carbon black ("MA 100" manufactured by Mitsubishi Kasei Kogyo Kabushiki Kaisha). Thereafter, a carbon black dispersion having a solid concentration of 12% by weight and a carbon black/resin (weight) ratio of 80/20 was obtained by carrying out dispersion for 2 hours in the same manner except that the preliminary dispersion 1 was replaced by the preliminary dispersion 2 and the rotation speed of Ultra Apex Mill was changed from 8 m/second to 8 m/20 seconds.

The structures of compounds used in Examples and Comparative Examples are shown below.

[Chemical Formula 8]

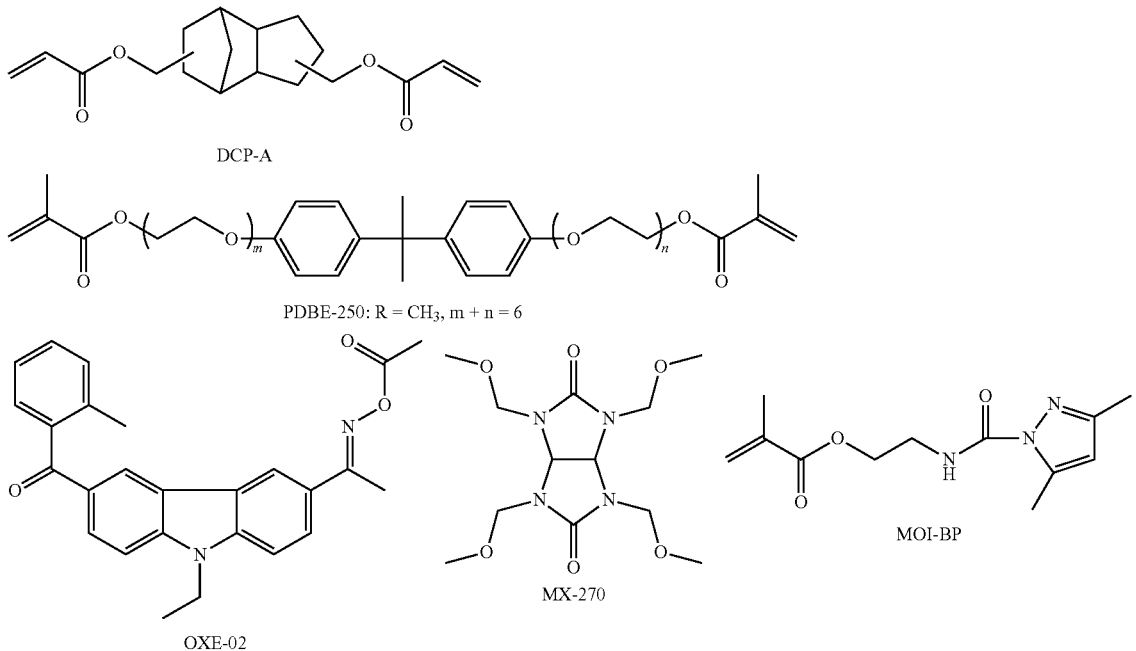

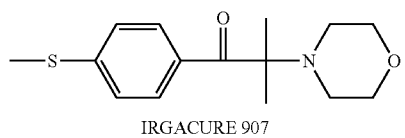

IRGACURE 907

Example 1

10.0 g of polyimide powder obtained in Synthesis Example 2, 12.0 g of YMF-02 (trade name, manufactured by Sumitomo Metal Mining Co., Ltd., $Cs_{0.33}WO_3$ dispersion concentration: 20% by weight) as a compound represented by the general formula (1) or (2), 3.0 g of PDBE-250 (trade name, manufactured by NOF CORPORATION) as a photopolymerizable compound having two polymerizable groups, 3.0 g of Light Acrylate DCP-A (trade name, manufactured by KYOEISHA CHEMICAL Co., LTD.) and 3.0 g of OXE-02 (trade name, manufactured by Chiba Specialty Chemicals Co., Ltd.) as an oxime-type photopolymerization initiator were dissolved in 12 g of diacetone alcohol to obtain a varnish A as a photosensitive resin composition. Using the obtained varnish A, the pattern shape and shallowness were evaluated as described previously and the light permeabilities of a laminate and a photosensitive resin film were measured.

Example 2

A varnish B as a photosensitive resin composition was obtained in the same manner as in Example 1 except that 10.0 g of polyamide acid ester obtained in Synthesis Example 3 was used in place of the polyimide powder obtained in Synthesis Example 2. Using the obtained varnish B, evaluations were made in the same manner as in Example 1.

Example 3

A varnish C as a photosensitive resin composition was obtained in the same manner as in Example 1 except that 10.0 g of polyhydroxyamide powder obtained in Synthesis Example 4 was used in place of the polyimide powder obtained in Synthesis Example 2 and GBL was used in place of diacetone alcohol. Using the obtained varnish C, evaluations were made in the same manner as in Example 1.

Example 4

A varnish D as a photosensitive resin composition was obtained in the same manner as in Example 1 except that the added amount of YMF-02 was changed from 12.0 g to 7.5 g and GBL was used in place of diacetone alcohol. Using the obtained varnish D, evaluations were made in the same manner as in Example 1.

Example 5

A varnish E as a photosensitive resin composition was obtained in the same manner as in Example 1 except that the added amount of YMF-02 (trade name, manufactured by Sumitomo Metal Mining Co., Ltd.) was changed from 12.0 g to 17.5 g. Using the obtained varnish E, evaluations were made in the same manner as in Example 1.

Example 6

A varnish F as a photosensitive resin composition was obtained in the same manner as in Example 1 except that 2.4 g of CsWO012-3 (trade name, manufactured by NanoGram Corporation, $Cs0_{.4}WO_3$) was used in place of 12.0 g of YMF-02 (trade name, manufactured by Sumitomo Metal Mining Co., Ltd.). Using the obtained varnish F, evaluations were made in the same manner as in Example 1.

Example 7

A varnish G as a photosensitive resin composition was obtained in the same manner as in Example 1 except that 3.0 g of MX-270 (trade name, manufactured by Midori Kagaku Co., Ltd.) was further used and 12.0 g of GBL was used in place of diacetone alcohol. Using the obtained varnish G, evaluations were made in the same manner as in Example 1.

Example 8

A varnish H as a photosensitive resin composition was obtained in the same manner as in Example 1 except that 2.4 g of CsWO009-04 (trade name, manufactured by NanoGram Corporation, $Cs_{0.1}WO_3$) was used in place of 12.0 g of YMF-02 (trade name, manufactured by Sumitomo Metal Mining Co., Ltd.). Using the obtained varnish H, evaluations were made in the same manner as in Example 1.

Example 9

10.0 g of polyimide powder obtained in Synthesis Example 2, 12.0 g of YMF-02 (trade name, manufactured by Sumitomo Metal Mining Co., Ltd., $Cs_{0.33}WO_3$ dispersion concentration: 20% by weight) as a compound represented by the general formula (1) or (2), 4.8 g of PDBE-250 (trade name, manufactured by NOF CORPORATION) as a photopolymerizable compound having two polymerizable groups, 1.2 g of MOI-BP (trade name, manufactured by Showa Denko K.K.) as a photopolymerizable compound having only one polymerizable group and 2.0 g of OXE-02 (trade name, manufactured by Chiba Specialty Chemicals Co., Ltd.) as an oxime-type photopolymerization initiator were dissolved in 12 g of diacetone alcohol to obtain a varnish I as a photosensitive resin composition. Using the obtained varnish I, evaluations were made in the same manner as in Example 1.

Example 10

A varnish J as a photosensitive resin composition was obtained in the same manner as in Example 9 except that 10.0 g of polyamide acid ester obtained in Synthesis Example 3 was used in place of the polyimide powder obtained in Synthesis Example 2. Using the obtained varnish J, evaluations were made in the same manner as in Example 1.

Example 11

A varnish K as a photosensitive resin composition was obtained in the same manner as in Example 9 except that 10.0 g of polyhydroxyamide powder obtained in Synthesis Example 4 were used in place of the polyimide powder obtained in Synthesis Example 2 and the added amount of PDBE-250 (trade name, manufactured by NOF CORPORATION) was changed from 4.8 g to 3.0 g, 3.0 g of DCP-A was used in place of 1.2 g of MOI-BP (trade name, manufactured by Showa Denko K.K.) and GBL was used in place of diacetone alcohol. Using the obtained varnish K, evaluations were made in the same manner as in Example 1.

Example 12

A varnish L as a photosensitive resin composition was obtained in the same manner as in Example 9 except that the added amount of YMF-02 (trade name, manufactured by Sumitomo Metal Mining Co., Ltd.) was changed from 12.0 g to 7.5 g and GBL was used in place of diacetone alcohol. Using the obtained varnish L, evaluations were made in the same manner as in Example 1.

Example 13

A varnish M as a photosensitive resin composition was obtained in the same manner as in Example 9 except that the added amount of YMF-02 (trade name, manufactured by Sumitomo Metal Mining Co., Ltd.) was changed from 12.0 g to 17.5 g. Using the obtained varnish M, evaluations were made in the same manner as in Example 1.

Example 14

A varnish N as a photosensitive resin composition was obtained in the same manner as in Example 9 except that the added amount of PDBE-250 (trade name, manufactured by NOF CORPORATION) was changed from 4.8 g to 5.4 g and the added amount of MOI-BP (trade name, manufactured by Showa Denko K.K.) was changed from 1.2 g to 0.6 g. Using the obtained varnish N, evaluations were made in the same manner as in Example 1.

Example 15

A varnish O as a photosensitive resin composition was obtained in the same manner as in Example 9 except that 4.8 g of pentaerythritol triacrylate were used as a photopolymerizable compound having three polymerizable groups, in place of PDBE-250 (trade name, manufactured by NOF CORPORATION). Using the obtained varnish O, evaluations were made in the same manner as in Example 1.

Example 16

A varnish P as a photosensitive resin composition was obtained in the same manner as in Example 9 except that 2.4 g of CsWO012-3 (trade name, manufactured by NanoGram Corporation, $Cs_{0.4}WO_3$) was used in place of 12.0 g of YMF-02 (trade name, manufactured by Sumitomo Metal Mining Co., Ltd.). Using the obtained varnish P, evaluations were made in the same manner as in Example 1.

Example 17

A varnish Q as a photosensitive resin composition was obtained in the same manner as in Example 9 except that 2.4 g of CsWO009-04 (trade name, manufactured by NanoGram Corporation, $Cs_{0.1}WO_3$) was used in place of 12.0 g of YMF-02 (trade name, manufactured by Sumitomo Metal Mining Co., Ltd.). Using the obtained varnish Q, evaluations were made in the same manner as in Example 1.

Example 18

A varnish R as a photosensitive resin composition was obtained in the same manner as in Example 9 except that 3.0 g of MX-270 (trade name, manufactured by Midori Kagaku Co., Ltd.) was further used and 12.0 g of GBL were used in place of diacetone alcohol. Using the obtained varnish R, evaluations were made in the same manner as in Example 1.

Example 19

A varnish S as a photosensitive resin composition was obtained in the same manner as in Example 9 except that the added amount of YMF-02 (trade name, manufactured by Sumitomo Metal Mining Co., Ltd.) was changed from 12.0 g to 15.0 g and the added amount of OXE-02 (trade name, manufactured by Chiba Specialty Chemicals Co., Ltd.) was changed from 2.0 g to 0.7 g. Using the obtained varnish S, evaluations were made in the same manner as in Example 1.

Example 20

A photosensitive resin composition T was obtained in the same manner as in Example 9 except that MOI-BP (trade name, manufactured by Showa Denko K.K.) was not used and the added amount of PDBE-250 (trade name, manufactured by NOF CORPORATION) was changed from 4.8 g to 6 g. Using the obtained varnish T, evaluations were made in the same manner as in Example 1.

Comparative Example 1

A varnish U as a photosensitive resin composition was obtained in the same manner as in Example 1 except that 12.0 g of YMF-02 (trade name, manufactured by Sumitomo Metal Mining Co., Ltd.) was not included. Using the obtained varnish U, evaluations were made in the same manner as in Example 1.

Comparative Example 2

A varnish V as a photosensitive resin composition was obtained in the same manner as in Example 1 except that 2.4 g of titanium nitride particle dispersion obtained in Synthesis Example 6 was used in place of YMF-02 (trade name, manufactured by Sumitomo Metal Mining Co., Ltd.). Using the obtained varnish V, evaluations were made in the same manner as in Example 1.

Comparative Example 3

A varnish W as a photosensitive resin composition was obtained in the same manner as in Example 1 except that 2.4 g of carbon black dispersion obtained in Synthesis Example 7 was used in place of YMF-02 (trade name, manufactured by Sumitomo Metal Mining Co., Ltd.). Using the obtained varnish W, evaluations were made in the same manner as in Example 1.

Comparative Example 4

A varnish X as a photosensitive resin composition was obtained in the same manner as in Example 9 except that YMF-02 (trade name, manufactured by Sumitomo Metal Mining Co., Ltd.) was not contained. Using the obtained varnish X, evaluations were made in the same manner as in Example 1.

Comparative Example 5

A varnish Y as a photosensitive resin composition was obtained in the same manner as in Example 9 except that 25 g of titanium nitride particle dispersion 1 obtained in Synthesis Example 6 was used in place of YMF-02 (trade name, manufactured by Sumitomo Metal Mining Co., Ltd.). Using the obtained varnish Y, evaluations were made in the same manner as in Example 1.

Comparative Example 6

A varnish Z as a photosensitive resin composition was obtained in the same manner as in Example 9 except that 25 g of carbon black dispersion 2 obtained in Synthesis Example 7 was used in place of YMF-02 (trade name, manufactured by Sumitomo Metal Mining Co., Ltd.). Using the obtained varnish Z, evaluations were made in the same manner as in Example 1.

Comparative Example 7

A varnish AA as a photosensitive resin composition was obtained in the same manner as in Example 9 except that PDBE-250 (trade name, manufactured by NOF CORPORATION) was not used and the added amount of MOI-BP (trade name, manufactured by Showa Denko K.K.) was changed from 1.2 g to 6 g. Using the obtained varnish AA, evaluations were made in the same manner as in Example 1.

Comparative Example 8

A varnish AB as a photosensitive resin composition was obtained in the same manner as in Example 9 except that no polyimide powder was used, 10 g of pentaerythritol tetraacrylate was used in place of PDBE-250 (trade name, manufactured by NOF CORPORATION) and MOI-BP (trade name, manufactured by Showa Denko K.K.), and 0.3 g of Irgacure 907 (trade name, manufactured by Chiba Specialty Chemicals Co., Ltd.) was used in place of OXE-02 (trade name, manufactured by Chiba Specialty Chemicals Co., Ltd.). Using the obtained varnish AB, evaluations were made in the same manner as in Example 1.

Reference Example 1

Using the varnish A obtained in Example 1, evaluations were made in the same manner as in Example 1 except that a TEMPAX glass plate (permeability to light having a wavelength of 400 to 1300 nm: 100%) was used as a substrate.

The compositions of the photosensitive resin compositions of Examples, Comparative Examples and Reference Example are shown in Tables 1 to 3 and the evaluation results are shown in Tables 4 to 6.

TABLE 1

| | Varnish | (a) Polyimide, polybenzoxazole or precursor thereof Added amount | (b) Compound represented by general formula (1) or (2) Added amount | Parts by weight based on 100 parts by weight of resin (a) | (c) Photopolymerizable compound Added amount | | (d) Photopolymerization initiator Added amount | (e) Solvent Added amount | Others Added amount | Substrate |
|---|---|---|---|---|---|---|---|---|---|---|
| Example 1 | A | Polyimide 10 g | YMF-02 12.0 g | 24 parts by weight | DCP-A 3.0 g | PDBE-250 3.0 g | OXE-02 3.0 g | diacetone alcohol 12 g | — | Si wafer |
| Example 2 | B | Polyamide acid ester 10 g | YMF-02 12.0 g | 24 parts by weight | DCP-A 3.0 g | PDBE-250 3.0 g | OXE-02 3.0 g | diacetone alcohol 12 g | — | Si wafer |
| Example 3 | C | Polyhydroxy-amide 10 g | YMF-02 12.0 g | 24 parts by weight | DCP-A 3.0 g | PDBE-250 3.0 g | OXE-02 3.0 g | γ-butyro-lactone 12 g | — | Si wafer |
| Example 4 | D | Polyimide 10 g | YMF-02 7.5 g | 15 parts by weight | DCP-A 3.0 g | PDBE-250 3.0 g | OXE-02 3.0 g | γ-butyro-lactone 12 g | — | Si wafer |
| Example 5 | E | Polyimide 10 g | YMF-02 17.5 g | 35 parts by weight | DCP-A 3.0 g | PDBE-250 3.0 g | OXE-02 3.0 g | diacetone alcohol 12 g | — | Si wafer |
| Example 6 | F | Polyimide 10 g | CsWO012-03 2.4 g | 24 parts by weight | DCP-A 3.0 g | PDBE-250 3.0 g | OXE-02 3.0 g | diacetone alcohol 12 g | — | Si wafer |
| Example 7 | G | Polyimide 10 g | YMF-02 12.0 g | 24 parts by weight | DCP-A 3.0 g | PDBE-250 3.0 g | OXE-02 3.0 g | γ-butyro-lactone 12 g | MX-270 3.0 g | Si wafer |
| Example 8 | H | Polyimide 10 g | CsWO009-04 2.4 g | 24 parts by weight | DCP-A 3.0 g | PDBE-250 3.0 g | OXE-02 3.0 g | diacetone alcohol 12 g | | Si wafer |

TABLE 2

| | Varnish | (a) Polyimide, polybenzoxazole or precursor thereof Added amount | (b) Compound represented by general formula (1) or (2) Added amount | Parts by weight based on 100 parts by weight of resin (a) | (c) Photopolymerizable compound Added amount | | (d) Photopolymerization initiator Added amount | (e) Solvent Added amount | Others Added amount | Substrate |
|---|---|---|---|---|---|---|---|---|---|---|
| Example 9 | I | Polyimide 10 g | YMF-02 12.0 g | 24 parts by weight | PDBE-250 4.8 g | MOI-BP 1.2 g | OXE-02 2.0 g | diacetone alcohol 12 g | — | Si wafer |
| Example 10 | J | Polyamide acid ester 10 g | YMF-02 12.0 g | 24 parts by weight | PDBE-250 4.8 g | MOI-BP 1.2 g | OXE-02 2.0 g | diacetone alcohol 12 g | — | Si wafer |

TABLE 2-continued

| | Varnish | (a) Polyimide, polybenzoxazole or precursor thereof Added amount | (b) Compound represented by general formula (1) or (2) Added amount | Parts by weight based on 100 parts by weight of resin (a) | (c) Photopolymerizable compound Added amount | | (d) Photopolymerization initiator Added amount | (e) Solvent Added amount | Others Added amount | Substrate |
|---|---|---|---|---|---|---|---|---|---|---|
| Example 11 | K | Polyhydroxyamide 10 g | YMF-02 12.0 g | 24 parts by weight | DCP-A 3.0 g | PDBE-250 3.0 g | OXE-02 2.0 g | γ-butyrolactone 12 g | — | Si wafer |
| Example 12 | L | Polyimide 10 g | YMF-02 7.5 g | 15 parts by weight | PDBE-250 4.8 g | MOI-BP 1.2 g | OXE-02 2.0 g | γ-butyrolactone 12 g | — | Si wafer |
| Example 13 | M | Polyimide 10 g | YMF-02 17.5 g | 35 parts by weight | PDBE-250 4.8 g | MOI-BP 1.2 g | OXE-02 2.0 g | diacetone alcohol 12 g | — | Si wafer |
| Example 14 | N | Polyimide 10 g | YMF-02 12.0 g | 24 parts by weight | PDBE-250 5.4 g | MOI-BP 0.6 g | OXE-02 2.0 g | diacetone alcohol 12 g | — | Si wafer |
| Example 15 | O | Polyimide 10 g | YMF-02 12.0 g | 24 parts by weight | Pentaerythritol triacrylate 4.8 g | MOI-BP 1.2 g | OXE-02 2.0 g | diacetone alcohol 12 g | — | Si wafer |
| Example 16 | P | Polyimide 10 g | CsWO012-03 2.4 g | 24 parts by weight | PDBE-250 4.8 g | MOI-BP 1.2 g | OXE-02 2.0 g | diacetone alcohol 12 g | — | Si wafer |
| Example 17 | Q | Polyimide 10 g | CsWO009-04 2.4 g | 24 parts by weight | PDBE-250 4.8 g | MOI-BP 1.2 g | OXE-02 2.0 g | diacetone alcohol 12 g | — | Si wafer |
| Example 18 | R | Polyimide 10 g | YMF-02 12.0 g | 24 parts by weight | PDBE-250 4.8 g | MOI-BP 1.2 g | OXE-02 2.0 g | γ-butyrolactone 12 g | MX-270 3.0 g | Si wafer |
| Example 19 | S | Polyimide 10 g | YMF-02 15.0 g | 30 parts by weight | PDBE-250 4.8 g | MOI-BP 1.2 g | OXE-02 0.7 g | γ-butyrolactone 12 g | — | Si wafer |
| Example 20 | T | Polyimide 10 g | YMF-02 12.0 g | 24 parts by weight | PDBE-250 6.0 g | — | OXE-02 2.0 g | diacetone alcohol 12 g | — | Si wafer |

TABLE 3

| | Varnish | (a) Polyimide, polybenzoxazole or precursor thereof Added amount | (b) Compound represented by general formula (1) or (2) Added amount | Parts by weight based on 100 parts by weight of resin (a) | (c) Photopolymerizable compound Added amount | | (d) Photopolymerization initiator Added amount | (e) Solvent Added amount | Others Added amount | Substrate |
|---|---|---|---|---|---|---|---|---|---|---|
| Comparative Example 1 | U | Polyimide 10 g | — | 0 parts by weight | DCP-A 3.0 g | PDBE-250 3.0 g | OXE-02 3.0 g | diacetone alcohol 12 g | — | Si wafer |
| Comparative Example 2 | V | Polyimide 10 g | — | 0 parts by weight | DCP-A 3.0 g | PDBE-250 3.0 g | OXE-02 3.0 g | diacetone alcohol 12 g | Dispersion 1 2.4 g | Si wafer |
| Comparative Example 3 | W | Polyimide 10 g | — | 0 parts by weight | DCP-A 3.0 g | PDBE-250 3.0 g | OXE-02 3.0 g | diacetone alcohol 12 g | Dispersion 2 2.4 g | Si wafer |
| Comparative Example 4 | X | Polyimide 10 g | — | 0 parts by weight | PDBE-250 4.8 g | MOI-BP 1.2 g | OXE-02 2.0 g | diacetone alcohol 12 g | — | Si wafer |
| Comparative Example 5 | Y | Polyimide 10 g | — | 0 parts by weight | PDBE-250 4.8 g | MOI-BP 1.2 g | OXE-02 2.0 g | diacetone alcohol 12 g | Dispersion 1 25 g | Si wafer |
| Comparative Example 6 | Z | Polyimide 10 g | — | 0 parts by weight | PDBE-250 4.8 g | MOI-BP 1.2 g | OXE-02 2.0 g | diacetone alcohol 12 g | Dispersion 2 25 g | Si wafer |
| Comparative Example 7 | AA | Polyimide 10 g | YMF-02 12.0 g | 24 parts by weight | — | MOI-BP 6.0 g | OXE-02 2.0 g | diacetone alcohol 12 g | — | Si wafer |
| Comparative Example 8 | AB | — | YMF-02 12.0 g | 24 parts by weight | Pentaerythritol tetraacrylate 10 g | — | Irgacure 907 0.3 g | diacetone alcohol 12 g | — | Si wafer |
| Reference Example 1 | A | Polyimide 10 g | YMF-02 12.0 g | 24 parts by weight | DCP-A 3.0 g | PDBE-250 3.0 g | OXE-02 3.0 g | diacetone alcohol 12 g | — | TEMPAX glass plate |

TABLE 4

| | Varnish | Maximum value of permeability of laminate to light having a wavelength of 400 to 1300 nm inclusive | Permeability of cured film to light having a wavelength of 500 nm | Maximum value of permeability of cured film to light having a wavelength of longer than 900 nm and not longer than 1300 nm | Shape of pattern | shallowness |
|---|---|---|---|---|---|---|
| Example 1 | A | 0.2% | 62% | 2.5% | 90% | ○ |
| Example 2 | B | 0.2% | 62% | 2.5% | 90% | ○ |
| Example 3 | C | 0.2% | 62% | 2.5% | 90% | ○ |
| Example 4 | D | 0.5% | 68% | 6.0% | 94% | ○ |
| Example 5 | E | 0.1% | 45% | 0.05% | 87% | Δ |
| Example 6 | F | 0.2% | 62% | 2.5% | 92% | ○ |
| Example 7 | G | 0.2% | 62% | 2.5% | 93% | ○ |
| Example 8 | H | 4.5% | 62% | 5.0% | 97% | ○ |

TABLE 5

| | Varnish | Maximum value of permeability of laminate to light having a wavelength of 400 to 1300 nm inclusive | Permeability of cured film to light having a wavelength of 500 nm | Maximum value of permeability of cured film to light having a wavelength of longer than 900 nm and not longer than 1300 nm | Shape of pattern | Shallowness |
|---|---|---|---|---|---|---|
| Example 9 | I | 0.20% | 63% | 2.5% | 90% | ⊙ |
| Example 10 | J | 0.20% | 63% | 2.5% | 90% | ⊙ |
| Example 11 | K | 0.20% | 62% | 2.5% | 90% | ○ |
| Example 12 | L | 0.5% | 69% | 7.0% | 94% | ⊙ |
| Example 13 | M | 0.1% | 45% | 0.05% | 87% | ○ |
| Example 14 | N | 0.2% | 60% | 2.3% | 89% | ○ |
| Example 15 | O | 0.2% | 63% | 2.5% | 92% | ⊙ |
| Example 16 | P | 4.5% | 62% | 5.0% | 97% | ⊙ |
| Example 17 | Q | 0.2% | 62% | 2.5% | 93% | ⊙ |
| Example 18 | R | 0.2% | 62% | 2.5% | 94% | ⊙ |
| Example 19 | S | 0.2% | 61% | 2.5% | 52% | ⊙ |
| Example 20 | T | 0.2% | 60% | 2.5% | 89% | Δ |

TABLE 6

| | Varnish | Maximum value of permeability of laminate to light having a wavelength of 400 to 1300 nm inclusive | Permeability of cured film to light having a wavelength of 500 nm | Maximum value of permeability of cured film to light having a wavelength of longer than 900 nm and not longer than 1300 nm | Shape of pattern | Shallowness |
|---|---|---|---|---|---|---|
| Comparative Example 1 | U | 62.0% | 70% | 30.0% | 100% | ⊙ |
| Comparative Example 2 | V | 1.0% | 1% | 0% | Pattern could not be formed | Pattern could not be formed |
| Comparative Example 3 | W | 1.0% | 1% | 0% | Pattern could not be formed | Pattern could not be formed |
| Comparative Example 4 | X | 62.0% | 70% | 30.0% | 100% | ⊙ |

TABLE 6-continued

| | Varnish | Maximum value of permeability of laminate to light having a wavelength of 400 to 1300 nm inclusive | Permeability of cured film to light having a wavelength of 500 nm | Maximum value of permeability of cured film to light having a wavelength of longer than 900 nm and not longer than 1300 nm | Shape of pattern | Shallowness |
|---|---|---|---|---|---|---|
| Comparative Example 5 | Y | 1% | 1% | 0% | Pattern could not be formed | Pattern could not be formed |
| Comparative Example 6 | Z | 1% | 1% | 0% | Pattern could not be formed | Pattern could not be formed |
| Comparative Example 7 | AA | 0.2% | 63% | 2.5% | Pattern could not be formed | Pattern could not be formed |
| Comparative Example 8 | AB | 2.0% | 65% | 3.0% | Pattern could not be formed | Pattern could not be formed |
| Reference Example 1 | A | 62.0% | 62% | 2.5% | 90% | ⊙ |

INDUSTRIAL APPLICABILITY

Insulating properties and light-shielding properties against light having a wavelength lying in an ultraviolet range, a visible range and a near-infrared range can be imparted by applying a photosensitive resin composition of the present invention onto a substrate which has such properties that the permeability to light having a wavelength of 400 to 900 nm inclusive is less than 3.0% and the maximum value of the permeability to light having a wavelength longer than 900 nm and no longer than 1300 nm is 3.0% or more. Accordingly, a solid-state imaging device can be provided using a simpler and more productive method.

REFERENCE SIGNS LIST 1 solder ball
2 solid-state imaging element
3 semiconductor substrate
4 mounting substrate
5 insulating layer
6 light-shielding layer
7 through electrode
8 IR cut filter
9 lens holder
10 lens
11 glass
12 spacer
13 light-shielding and insulating layer

The invention claimed is:

1. A photosensitive resin composition which comprises:
(a) a polyimide, a polybenzoxazole or a precursor thereof,
(b) a tungsten oxide and/or a composite tungsten oxide represented by the following general formula (1) or (2), wherein the tungsten oxide and/or composite tungsten oxide is present in an amount of 5 to 60 parts by weight based on 100 parts by weight of the polyimide, polybenzoxazole or precursor thereof (a),
(c) a photopolymerizable compound having at least two polymerizable groups,
(d) an oxime-type photopolymerization initiator, and
(e) a solvent, $$W_yO_z \quad (1)$$

wherein W is tungsten, O is oxygen, $y>0$, $z>0$, and $2.2 \leq z/y \leq 3$ $$M_xW_yO_z \quad (2)$$

wherein element M is at least one element selected from H, He, an alkali metal, an alkali earth metal, a rare earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi and I, W is tungsten, O is oxygen, $x>0$, $y>0$, $z>0$, $0.001 \leq x/y \leq 1.1$ and $2.2 \leq z/y \leq 3.0$.

2. The photosensitive resin composition according to claim 1, further comprising (c)' a photopolymerizable compound having only one polymerizable group.

3. The photosensitive resin composition according claim 1, wherein the permeability to light having a wavelength of 500 nm is 40.0% or more and the permeability to light having a wavelength of longer than 900 nm and no longer than 1300 nm is less than 3.0% provided that (e) the solvent is removed to form a photosensitive resin film having a thickness of 25 μm, and the film is heat-treated by a hot plate at 100° C. for 3 minutes and then heat-treated in an oven at 180° C. under a nitrogen atmosphere (oxygen concentration 10 ppm or less) for 120 minutes.

4. A laminate which comprises a cured film formed by heat-treating a photosensitive resin film formed from the photosensitive resin composition according to claim 1 and having such properties that the permeability to light having a wavelength of 500 nm is 40.0% or more and the permeability to light having a wavelength of longer than 900 nm and no longer than 1300 nm is less than 3.0%, on a substrate which has such properties that the permeability to light having a wavelength of 400 to 900 nm inclusive is less than 3.0% and the maximum value of the permeability to light having a wavelength longer than 900 nm and no longer than 1300 nm is 3.0% or more.

5. The laminate according to claim 4, wherein the permeability to light having a wavelength of 400 nm to 1300 nm inclusive is 1.0% or less.

6. A method for producing a laminate, wherein the laminate is formed by heat-treating a photosensitive resin film formed from the photosensitive resin composition according to claim 1 on a substrate which has such properties that the permeability to light having a wavelength of 400 to 900 nm inclusive is less than 3.0% and the maximum value of the permeability to light having a wavelength longer than 900 nm and no longer than 1300 nm is 3.0% or more.

7. A solid-state imaging device equipped with the laminate according to claim 4.

8. The photosensitive resin composition according to claim 1, wherein element M is selected from Cs, Rb, K, Tl, In, Ba, Li Ca, Sr, Fe and Sn.

9. The photosensitive resin composition according to claim 1, wherein z is 2.2 to 3.0.

10. The photosensitive resin composition according to claim 1, wherein the tungsten oxide and/or composite tungsten oxide (b) is present in an amount of 18 to 30 parts by weight based on 100 parts by weight of the polyimide, polybenzoxazole or precursor thereof (a).

* * * * *